United States Patent [19]

Tsuruzono

[11] Patent Number: 5,767,568
[45] Date of Patent: Jun. 16, 1998

[54] SEMICONDUCTOR DEVICE

[75] Inventor: Kimihiro Tsuruzono, Kanagawa, Japan

[73] Assignee: Sony Corporation, Japan

[21] Appl. No.: 568,668

[22] Filed: Dec. 7, 1995

[30] Foreign Application Priority Data

Dec. 9, 1994 [JP] Japan .................................. 6-331917

[51] Int. Cl.$^6$ ................................................ H01L 23/495
[52] U.S. Cl. ............................ 257/667; 257/687; 257/690
[58] Field of Search .................................... 257/666, 667, 257/690, 701, 711, 787

[56] References Cited

U.S. PATENT DOCUMENTS

| 4,814,943 | 3/1989 | Okuaki | 361/400 |
| 4,866,506 | 9/1989 | Nambu et al. | 357/72 |

*Primary Examiner*—Sara W. Crane
*Assistant Examiner*—Douglas A. Wille
*Attorney, Agent, or Firm*—Ronald P. Kananen

[57] ABSTRACT

A highly reliable semiconductor device with an increased life is provided as comprising a wiring substrate comprising a portion for mounting a semiconductor pellet, a semiconductor pellet mounted on the portion for mounting the semiconductor pellet, an electrode provided on the wiring substrate connected to an electrode of the semiconductor pellet, a layer comprising a sealing material which seals the semiconductor pellet and the electrode provided on the wiring substrate, wherein at least a through hole for discharging water vapor is formed in the portion for mounting the semiconductor pellet provided on the wiring substrate, and the protective film for preventing the adhesion of solder or plating is removed from not only the soldered or plated portion but also the periphery of the portion for mounting the semiconductor pellet.

4 Claims, 3 Drawing Sheets

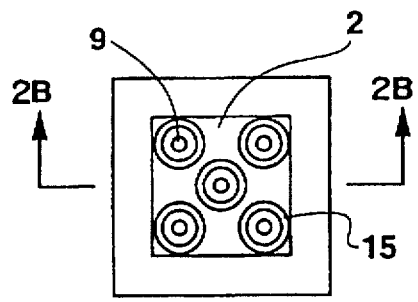
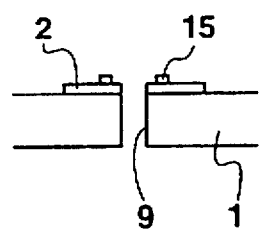
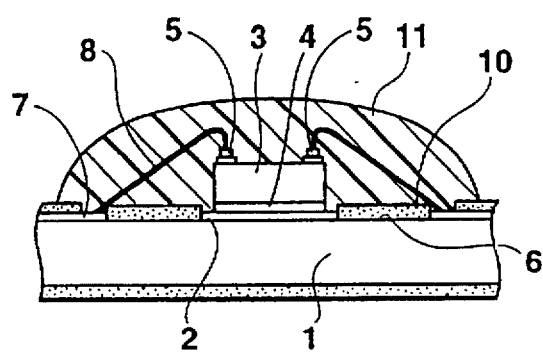
FIG. 3
(PRIOR ART)

SEMICONDUCTOR DEVICE

BACKGROUND OF THE INVENTION

The present invention relates to a semiconductor device, and particularly, to a semiconductor device comprising a semiconductor pellet adhered to a portion for mounting the semiconductor pellet on a wiring substrate, an electrode of the semiconductor pellet being connected to an electrode of the wiring substrate, and the semiconductor pellet, the electrode thereof, and the electrode of the wiring substrate being sealed with a sealing material.

Semiconductor devices known heretofore include structures shown by FIG. 3. Referring to FIG. 3, a semiconductor device of this type comprises a wiring substrate 1 being a base made of a resin, a metal, a ceramic, etc., and having wiring formed with a copper foil and the like on the surface thereof, a semiconductor pellet 3 being adhered to a semiconductor pellet mounting portion 2 provided on the surface of the wiring substrate 1 by using an adhesive 4 interposed therebetween, an electrode 5 of the semiconductor pellet 3 and an electrode 7 provided on the wiring substrate 1 being electrically connected (by wire bonding) with each other using a gold wire 8, and a sealing material 11 comprising a thermosetting resin (or a resin such as a thermoplastic resin or a ultraviolet-curable resin) sealing the semiconductor pellet 3 and the wire-bonded portion (the electrode 5 of the semiconductor pellet 3, the electrode 7 provided on the wiring substrate 1, and the gold wire 8). The electrode 7 provided on the interconnecting substrate 1 and the semiconductor mounting portion 2 for mounting are included in the wiring formed from a copper foil.

The wiring provided on the wiring substrate 1 above (such as the semiconductor pellet mounting portion 2, the electrodes 7, etc.) is formed generally by an etching process of a copper foil of the copper-clad laminated sheet. The copper-clad laminated sheet can be obtained by cladding a laminated sheet with a copper foil whose surface is roughened by a special treatment. Thus, the copper foil bites into the laminated sheet at the interface between the copper foil and the laminated sheet. The wiring substrate 1 exposes an irregular surface where no wiring is provided, i.e., the exposed surface 6 from which copper foil is removed.

In general, the semiconductor device above is electrically connected with another semiconductor device or a wiring substrate by means of a soldering process such as reflow soldering. Thus, to prevent the solder from adhering to the unnecessary portions of the surface of the wiring substrate 1, the portions are often coated with a protective film (a solder resist film) 10. Because the protective film 10 prevents a solder or a plating from adhering to the unwanted portions, in a conventional process, it is applied uniformly to the entire surface of the wiring substrate 1 except for the semiconductor pellet mounting portion 2 thereon and the electrode 7.

In a conventional semiconductor device as described above with reference to FIG. 3, the semiconductor pellet 3 and the connected portion (comprising the electrode 5 of the semiconductor pellet 3, the electrode 7 on the wiring substrate 1, and the gold wire 8) by wire bonding are covered with a sealing material 11 to be sealed by hardening the sealing material 11 by means of, for instance, heating (or cooling, or an ultraviolet irradiation). However, the cooling after heating caused warping of the wiring substrate 1 due to the difference in coefficient of thermal expansion between the interconnecting substrate 1 and the sealing material 11. FIG. 4A is a cross sectional view of a wiring substrate 1 on which the problematic warping occurred. Such a warping causes separation of the sealing material 11 from the surface of the wiring substrate 1 to produce cracks at the interface 12 between the wiring substrate 1 and the sealing material 11. Accordingly, a means of preventing warping from occurring has been demanded.

In a conventional semiconductor device, furthermore, the sealing material 11 and the interconnecting substrate 1 absorb moisture from the air, and the thus absorbed moisture is vaporized to expand when heated during reflow soldering. This, as shown in FIG. 4B, causes separation of the inherently inferior adhesive interface 12a between the adhesive 4 and the semiconductor pellet mounting portion 2. This separation cannot be ignored because it may lead to further interface separation 13 between the sealing material 11 and the protective film 10 or to cohesive failure 14 of the protective film 10. Such interface separation 13 and cohesive failure 14 are referred to collectively as reflow cracks.

Some technical proposals are made to overcome the problems above in unexamined published Japanese utility model applications Nos. Hei 5-48338 through Hei 5-48344.

The proposed technique comprises connecting the electrode of a semiconductor pellet mounted on a wiring substrate with the electrode of the wiring substrate, providing a frame-like or rod-like protrusion, groove, or a complex structure thereof on the outer side of the connecting portion so as to surround the semiconductor pellet, and sealing the semiconductor pellet and the like inclusive of such protrusion, groove, etc. Providing such a groove extends a path for moisture entering the semiconductor device, and hence, it takes a longer duration of time before reaching the semiconductor pellet. Furthermore, the protrusion increases the adhesiveness between the sealing material and the wiring substrate to prevent separation from occurring therebetween. Thus, as a whole, a semiconductor device with a longer life can be provided.

However, in the fabrication of the semiconductor device above, an additional step of providing a frame-like or rod-like groove or protrusion is required. Such an additional step of fabrication is greatly disadvantageous because it results in a process with increased steps and cost of production. Furthermore, it has no effect on preventing reflow cracks from generating.

The present invention has been accomplished with an aim to overcome the aforementioned problems. Accordingly, the present invention provides a semiconductor device comprising a semiconductor pellet adhered to a semiconductor pellet mounting portion provided on a wiring substrate, an electrode of the semiconductor pellet and an electrode on the wiring substrate being connected to each other, and a sealing material, sealing the semiconductor pellet, the electrode thereof, and the electrode on the wiring substrate, in which device reflow cracks such as interface separation between the sealing material and the wiring substrate or the cohesive failure of the sealing material, which are due to the expansion of the vaporized moisture absorbed by the sealing material or the wiring substrate in hot reflow soldering, are prevented from being generated and an improved reliability and a longer life are provided.

SUMMARY OF THE INVENTION

According to a first aspect of the present invention, there is provided a semiconductor device having at least a through hole, which is a water vapor discharging hole in the semiconductor pellet mounting portion on the interconnecting substrate.

The hole provided on the wiring substrate discharges vaporized water expanding during reflow soldering to the outside and hence, the generation of reflow cracks due to expanding force can be prevented. Thus, the problem of reflow cracks can be eliminated.

According to a second aspect of the present invention, there is provided a semiconductor device comprising protrusions formed around the periphery of the water vapor discharging hole so as to prevent the hole from adhesive the entering thereinto in case the semiconductor pellet is adhered to the portion for mounting the semiconductor pellet. Thus, water vapor discharging holes can be formed in the process without causing any problem.

According to a third aspect of the present invention, there is provided a semiconductor device in which a protective film for preventing the adhesion of solder or plating being removed from not only the portions to be soldered or plated but also the portions around the periphery of the portion for mounting a semiconductor pellet, by which the device comprises the sealing material and the portion of the wiring substrate from which the wiring film is removed are able to be brought into tight contact.

Such a device also provides no protective film formed around the periphery of the portion for mounting a semiconductor pellet, so that the roughened surface of the peripheral portion without wiring film can be brought into direct contact with the sealing material. Thus, a strong adhesion can be provided between the sealing material and the wiring substrate, by which reflow cracks can be prevented from generating.

BRIEF DESCRIPTION OF THE DRAWINGS

FIG. 2A is a plan view showing another embodiment of a semiconductor device according to the present invention;

FIG. 2B is a cross sectional view of the semiconductor device taken along line B—B in FIG. 2A;

FIG. 3 is a cross sectional view of a semiconductor device of a conventional type;

DETAILED DESCRIPTION OF THE INVENTION

The present invention is described in further detail below by making reference to examples and accompanying figures.

Figure 1A:
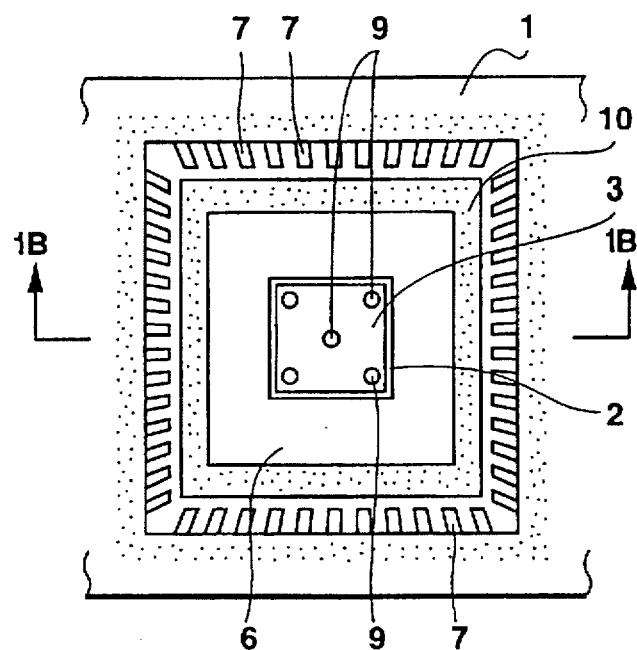
FIG. 1A is a plan view showing an embodiment of a semiconductor device according to the present invention.
Figure 1B:
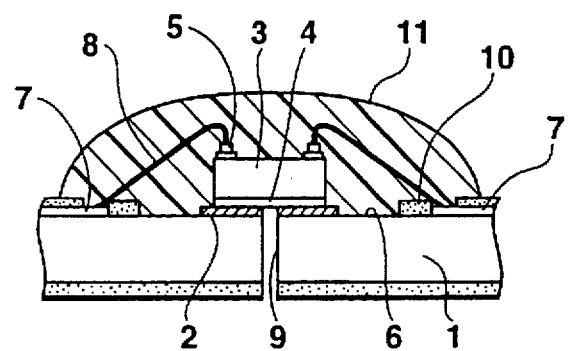
FIG. 1B is a cross sectional view of the semiconductor device taken along line B—B in FIG. 1A.

FIGS. 1A and 1B show an embodiment of a semiconductor device according to the present invention, wherein FIG. 1A is a plan view of a wiring substrate, and FIG. 1B is a cross sectional view of the semiconductor device cut along line B—B drawn in FIG. 1A.

The semiconductor device according to the embodiment is similar to a conventional semiconductor device with reference to FIG. 3, but it greatly differs in that the semiconductor device of the embodiment comprises a water vapor discharging hole 9 and that the surface of the base is exposed because a protective film 10 is not formed on the peripheral portion of the semiconductor pellet mounting portion 2. The description of the structure common to both conventional and the present semiconductor devices is provided in the foregoing, and is therefore omitted in the explanation hereinafter. The like portions illustrated through the figures are designated with the same reference numeral.

Referring to FIGS. 1A and 1B, penetrating water vapor discharging holes 9 are provided in the wiring substrate 1, in the area on which the semiconductor pellet mounting portion 2 is formed in the later steps. The semiconductor device of the embodiment is characterized particularly in that it comprises the water vapor discharging holes 9.

Figure 4A:
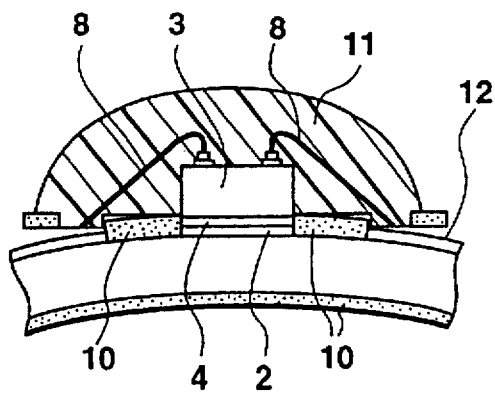
FIG. 4A is a cross sectional view showing a type of problem encountered in a semiconductor device of a conventional type illustrated in FIG. 3.
Figure 4B:
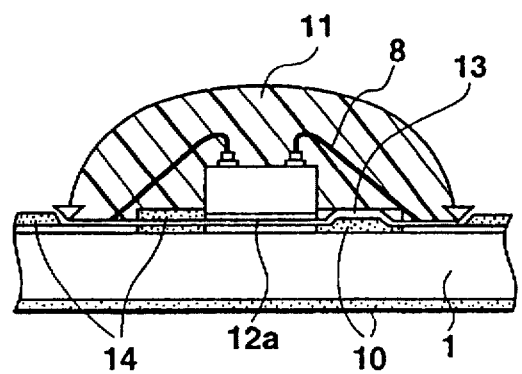
FIG. 4B is a cross sectional view showing another type of problem encountered in a semiconductor device of a conventional type illustrated in FIG. 3.

Thus, when the semiconductor device of the present invention is mounted on another semiconductor device or a wiring substrate and is subjected to soldering for electrical connection by means of reflow soldering, water incorporated in the sealing material 11 or the wiring substrate 1 is vaporized by heating, but is discharged through the water vapor discharging holes 9 without considerable expansion. Hence, even if separation of the poorly adhered semiconductor pellet 3 from the semiconductor pellet mounting portion 2 is initiated at the interface, the propagation of the separation can be stopped. Thus, the generation of reflow cracks such as the interface separation 13 between the sealing material 11 and the wiring substrate 1 as described with reference to FIG. 4B or the cohesive failure 14 of the sealing material 11 or the wiring substrate 1 as described above with reference to FIG. 4B can be avoided.

Furthermore, in the semiconductor device according to the present invention, the protective film 10 and also is removed from the periphery of the semiconductor pellet mounting portion 2 together with the copper foil to expose the irregular surface of the base. This is another characteristic feature of the semiconductor device according to the present invention. The exposed surface 6 from which the copper foil is removed is located in the periphery of the semiconductor pellet 3.

That is, the protective film 10 which prevents the adhesion of soldering or plating is not formed from the initial stage of the process on the portion where soldering or plating is necessary (see FIG. 3). However, in the semiconductor device according to the present invention, the surface 6 of the base having irregularities is also exposed. Thus, a tight adhesion can be provided between the sealing material 11 and the irregular surface of the wiring substrate 1 to prevent separation from occurring between the sealing material 11 and the wiring substrate 1. Thus, a highly reliable and long-life semiconductor device can be provided.

FIGS. 2A and 2B show a modified embodiment of a semiconductor device according to the present invention, wherein FIG. 2A is a plan view of the wiring substrate, and FIG. 2B is a cross sectional view of the semiconductor device taken along line B—B drawn in FIG. 2A.

In the semiconductor device above, frame-like protrusions 15 is formed in the periphery of each of the water vapor discharging holes 9. The protrusions 15 prevent an adhesive from entering into the water vapor discharging holes 9 during the step of making the semiconductor pellet 3 adhere to the semiconductor pellet mounting portion 2. Thus, the semiconductor device can be fabricated smoothly without being disturbed by any problem.

The semiconductor device of the modified embodiment is essentially the same as that of the semiconductor device illustrated in FIG. 1, except that protrusions 15, are newly provided.

Conclusively, the device according to the first aspect of the present invention provides at least a hole on the wiring substrate to discharge water vapor. Then, vaporized water expanding during reflow soldering can be discharged to the outside through the hole and hence, the generation of reflow cracks due to expanding force can be prevented. Thus, the problem of reflow cracks can be eliminated.

The device according to the second aspect of the present invention provides a protrusion around the periphery of the water vapor discharging hole. Then, adhesives entering into the through hole can be prevented in case the semiconductor pellet is adhered to the portion for mounting the semiconductor pellet. Thus, water vapor discharging holes can be formed in the process without causing any problem.

The device according to the third aspect of the present invention provides no protective film around the periphery of the portion for mounting semiconductor pellet. Then, the roughened surface of the peripheral portion having no wiring film thereon can be brought into direct contact with the sealing material. Thus, a strong adhesion can be provided between the sealing material and the wiring substrate, by which reflow cracks can be prevented from generating.

While the invention has been described in detail and with reference to specific embodiments thereof, it will be apparent to one skilled in the art that various changes and modifications can be made therein without departing from the spirit and scope thereof.

What is claimed is:

1. A semiconductor device, comprising:

a semiconductor pellet;

a wiring substrate comprising a portion for mounting the semiconductor pellet;

an electrode provided on the wiring substrate connected to an electrode of the semiconductor pellet; and a layer comprising a sealing material which seals the semiconductor pellet and the electrode provided on the wiring substrate;

the wiring substrate being provided with at least a through hole formed in the portion for mounting the semiconductor pellet, wherein a protrusion is formed around the periphery of the through hole on the side for mounting the semiconductor pellet.

2. A semiconductor device, comprising:

a semiconductor pellet;

a wiring substrate having a portion for mounting the semiconductor pellet, said semiconductor pellet being adhered to said portion of said wiring substrate for mounting the semiconductor pellet with an adhesive interposed therebetween;

an electrode of the semiconductor pellet and an electrode provided on the wiring substrate being electrically connected with each other;

at least one water vapor discharging opening provided in the wiring substrate and formed through the portion of said wiring substrate for mounting the semiconductor pellet to an opposed surface of the wiring substrate; and a frame-like protrusion formed in the periphery of the water vapor discharging opening to prevent adhesive from entering into the water vapor discharging opening.

3. A semiconductor device as set forth in claim 2, wherein a plurality of water vapor discharging openings are provided in the wiring substrate and formed through the portion of the wiring substrate for mounting the semiconductor pellet and an opposed surface of the wiring substrate.

4. A semiconductor device as set forth in claim 2, further including a protective film formed on the substrate between the portion for mounting the semiconductor pellet and the electrode on the wiring substrate wherein a portion of the protective film is removed to expose a surface of the substrate.

* * * * *